United States Patent [19]
Gersbach

[11] Patent Number: 5,642,116
[45] Date of Patent: Jun. 24, 1997

[54] SELF CALIBRATING SEGMENTED DIGITAL-TO-ANALOG CONVERTER

[75] Inventor: John E. Gersbach, Burlington, Vt.

[73] Assignee: International Business Machines Corporation, Armonk, N.Y.

[21] Appl. No.: 399,269

[22] Filed: Mar. 6, 1995

[51] Int. Cl.$^6$ ............................................... H03M 1/10
[52] U.S. Cl. ........................... 341/120; 341/121; 341/145
[58] Field of Search ................................. 341/118, 119, 341/120, 121, 144, 145, 153

[56] References Cited

U.S. PATENT DOCUMENTS

| | | |
|---|---|---|
| 4,465,996 | 8/1984 | Boyacigiller et al. . |
| 4,573,005 | 2/1986 | van de Plassche . |
| 5,017,919 | 5/1991 | Hult et al. ................. 341/136 |
| 5,153,592 | 10/1992 | Fairchild et al. . |
| 5,198,814 | 3/1993 | Ogawara et al. . |
| 5,270,716 | 12/1993 | Gleim . |
| 5,287,108 | 2/1994 | Mayes et al. . |
| 5,298,898 | 3/1994 | Brunheim . |

FOREIGN PATENT DOCUMENTS

| | | | |
|---|---|---|---|
| 1287290 | 1/1987 | U.S.S.R. ................. | 341/118 |

OTHER PUBLICATIONS

IEEE International Solid–State Circuits Conf., Feb. 15, 1990, pp. 168–169.
IEEE Journal of Solid–State Circuits, vol. SC–16, No. 6, Dec. 1981, pp. 616–620.
IEEE Transactions on Circuits and Systems, vol. CAS 30, No. 3, Mar. 1983, pp. 188–190.
IEEE Journal Solid–State Circuits, vol. 3C–19, No. 6, Dec. 1984, pp. 813–819.
Analog Devices, Design–In Reference Manual, 1994, pp. 3–15 to 3–23 and 3–71 to 3–82 Aug. 1994.

*Primary Examiner*—Jeffrey A. Gaffin
*Assistant Examiner*—Jason H. Vick
*Attorney, Agent, or Firm*—Richard M. Kotulak; Andrew J. Dillon

[57] ABSTRACT

A method of self calibration for a segmented digital-to-analog converter is provided. The segmented digital-to-analog converter converts a digital input code to an analog output consisting of an analog output step and an analog calibration factor. The method comprises the step of determining a trim value for each segment of a segmented DAC. The method continues by storing the trim values in memory. Then, the trim values for a plurality of segments preselected to be enabled by a given digital input signal are summed, thereby producing a digital calibration factor associated with each given digital input signal. Last, storing each digital calibration factor in memory at an address corresponding to the associated digital input signal. Thereafter, when a particular digital input signal is received by the DAC, the preselected plurality of segmented current sources are switched to produce the analog output step, and the corresponding digital calibration factor is converted to the analog calibration factor and switched to the output of the segmented DAC.

8 Claims, 6 Drawing Sheets

SELF CALIBRATING SEGMENTED DIGITAL-TO-ANALOG CONVERTER

BACKGROUND OF THE INVENTION

1. Technical Field

The present invention relates in general to digital-to-analog converters, and in particular to methods and systems for self-calibrating digital-to-analog converters.

2. Description of the Related Art

Digital-to-analog (D/A) conversion is the process of converting digital codes into a continuous range of analog signal levels. Digital-to-analog converters (DACs) are used in a variety of electronics, including high-performance digital audio equipment such as compact disc players. Some DACs are designed for special applications, such as video graphic outputs, high-definition video displays, ultra high-speed signal processing, digital video tape recording, digital attenuators, or high-speed function generators. In such applications, the dynamic behavior of the D/A conversion system plays an important role in overall performance. The major factors that determine the quality of performance of DACs are resolution, sampling rate, speed, and linearity. Generally, the accuracy of the DAC's measurement and conversion is specified by the converter's linearity.

"Integral linearity" is a measure of linearity over the entire conversion range. It is defined as the deviation from a straight line drawn between the maximum point and through zero (or the offset value) of the conversion range. "Differential linearity" is the linearity between or adjacent steps of the analog output. Differential linearity is a measure of the monotonicity of the converter. The converter is said to be monotonic if increasing input values result in increasing output values.

Digital codes are typically converted to analog voltages by assigning a voltage weight, or current weight, to each bit in the digital code and summing the voltage or current weights of the entire code. This type of DAC is called a binary weighted DAC, and it consists of a network of precision resistors, input switches, and level shifters to activate the switches to convert a digital code to an analog current or voltage. DACs that produce an analog current output usually have a faster settling time and better linearity than those that produce a voltage output, so DACs that utilize current sources are more often used.

As is well known in the art, a "segmented" DAC design converts digital codes to analog signals by activating a number of equally weighted segments proportional to the input digital code and summing the activated segments to form the analog output signal. Such a segmented DAC contains a large number of these equal valued segments, where each segment produces an equal current or voltage, to produce a large range of output levels.

While the ability to precisely process identical segments in segmentation schemes of this type improves differential linearity by a considerable amount over a straight binary weighted implementation, process tolerances are too large to achieve the integral linearity requirements of modern high performance digital to analog converters. Integral linearity can be expected to vary by as much as 3–6 LSBs in modern 10-bit segmented DACs.

To improve integral linearity of a binary weighted DAC, the analog output is calibrated and trimmed to bring the performance of the DAC closer to ideal. In the prior art, multiple reference sources provide a plurality of highly toleranced calibration signals that are toleranced within the required integral linearity for each analog output step corresponding to a digital input code. For example, the calibration signals may be accomplished by a voltage divider tapped at equal intervals of voltage levels. Each analog output step is compared with a corresponding calibration signal to determine the calibration error, and then the analog output for that binary code is trimmed to compensate for the error.

While this calibration scheme provides the required linearity, there remains some error because each output level is calibrated against a different reference source. What is needed is a calibration scheme having improved integral linearity, where every analog output level is calibrated with respect to the same reference source, thereby eliminating any non-linearity derived from using a plurality of calibration references that are not, themselves, perfectly toleranced.

In addition, such a scheme needs to be self-calibrating. Standard calibration schemes are performed when the DAC is manufactured, and the DAC is permanently trimmed. However, changes in the operating environment of the DAC over the life of the DAC, such as temperature or output load, may alter the calibration. Therefore, what is needed is a segmented DAC capable of self-calibration to allow continuous calibration over the life of the DAC. More particularly, what is needed is a segmented DAC capable of self-calibration with respect to a single calibration reference to improve differential linearity and integral linearity.

SUMMARY OF THE INVENTION

It is therefore one object of the present invention to provide a segmented DAC capable of self-calibration.

It is another object of the present invention to provide a segmented DAC capable of self-calibration with respect to a single calibration reference to improve differential linearity and integral linearity.

The foregoing objects are achieved as is now described. According to the present invention, a method of self calibration for a segmented digital-to-analog converter is provided. The segmented digital-to-analog converter converts a digital input code to an analog output consisting of an analog output step and an analog calibration factor. The method comprises the step of determining a trim value for each segment of a segmented DAC. The method continues by storing the trim values in memory. Then, the trim values for a plurality of segments preselected to be enabled by a given digital input signal are summed, thereby producing a digital calibration factor associated with each given digital input signal. Last, each digital calibration factor is stored in memory at an address corresponding to the associated digital input signal. Thereafter, when a particular digital input signal is received by the DAC, the preselected plurality of segmented current sources are switched to produce the analog output step, and the corresponding digital calibration factor is converted to the analog calibration factor and switched to the output of the segmented DAC.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
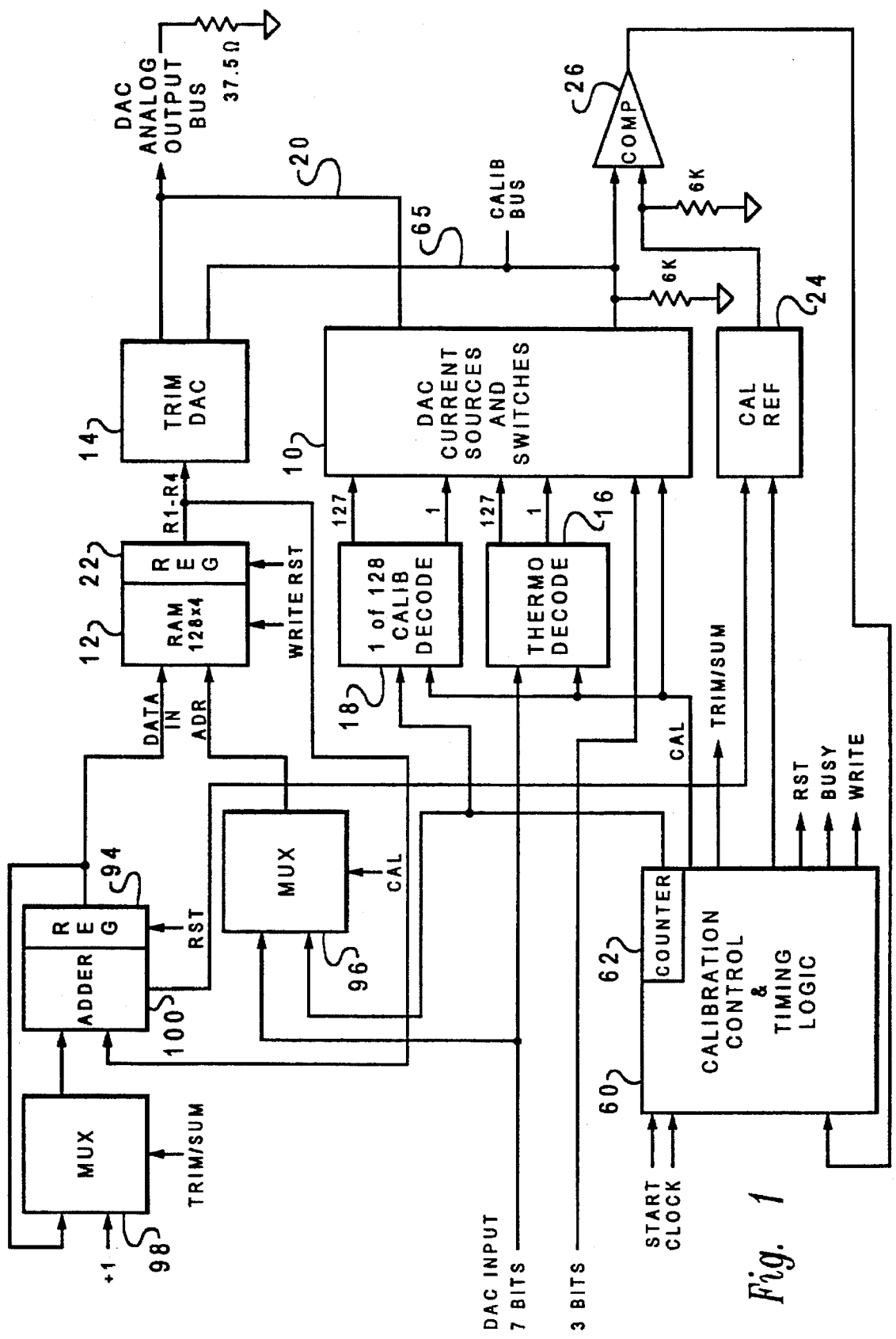
FIG. 1 depicts a schematic block diagram of a self-calibrating segmented DAC according to a preferred embodiment of the present invention.

Referring now to FIG. 1, there is depicted a schematic block diagram of a self-calibrating segmented DAC according to a preferred embodiment of the present invention. During normal operation, the output currents generated by the current source segments of Current Sources And Switches (CSS) 10 are routed to the output bus 20. Each word contained in RAM (Random Access Memory) 12 corresponds to a particular digital input code and represents a value that precisely sets the output of the trim DAC 14 (output onto output bus 20) to compensate for any error of non-linearity produced by the segments contained in CSS 10 that are turned on to produce the analog output for that particular digital input code. Each digital input code produces a major output level by the DAC, wherein a major output is defined as any multiple of the equal valued current that is output by each segment.

In the preferred embodiment, the DAC is a 10-bit DAC. The input to the DAC is a digital 10-bit code having three LSBs (Least Significant Bits) input bits and seven higher order bits. The three Least Significant Bits are input into an LSB circuit (shown in FIG. 2) in CSS 10, and they are directly switching binary weighted current sources with weights of 1, 2 and 4 Units. (A "Unit" will be used herein to define the amount of current necessary to change the analog output level 1 LSB of the digital input, and can be set to any arbitrary level—for example, 20 µA.) The 7 higher order bits are decoded by thermometric decoder 16 to switch 127 equal valued current sources, each with weights of 8 Units. The 127 high-order current sources are called segments, as is known by those skilled in the art. In total, the DAC of the preferred embodiment has 10 input bits, which produces 1024 discreet analog output levels ranging from 0–20 mA at its output.

A thermometric decoder, such as thermometric decoder 16, as used in the preferred embodiment, is one that outputs multiple control signals in response to a digital input. The number of control signals that are turned on is proportional to the digital code input. A thermometric decoder decodes the input code to a particular output pin located at an associated numerical level, as is customary for ordinary decoders, but the nature of the thermometric decoder is to activate the decoded output control signal, as well as all lower numerically numbered output control signals. For example, if the thermometric decoder input is 8 (1000 binary), then the decoder outputs a control signal on eight pins, designated as 8,7,6,5,4,3,2, and 1. In other words, the decoder is such that with an increasing input count, segment currents are added to the output, and, further, each segment remains in the output until the count decreases to a value less than that which caused it to be energized. The operation and design of a thermometric decoder are well known to those skilled in the art.

As will be appreciated by those skilled in the art, a segmented DAC using a thermometric decoder and current source segments, processed using current FET processing technology, produces a differential linearity of 1 LSB or less, which guarantees a monotonic output. That is to say, adjacent output steps will not decrease with an increasing input count or increase with a decreasing input count, and step sizes will lay within the range of 0 to 2 Units.

The Calibration Control And Timing Logic (CCTL) 60 shown in FIG. 1 controls the self-calibration of the DAC of the present invention. When the DAC is operating in a normal operating mode, the CCTL 60 negates its calibration signal (CAL). When a START command is received, while receiving a free running CLOCK, CCTL 60 will assert its calibration signal (CAL).

Figure 2:
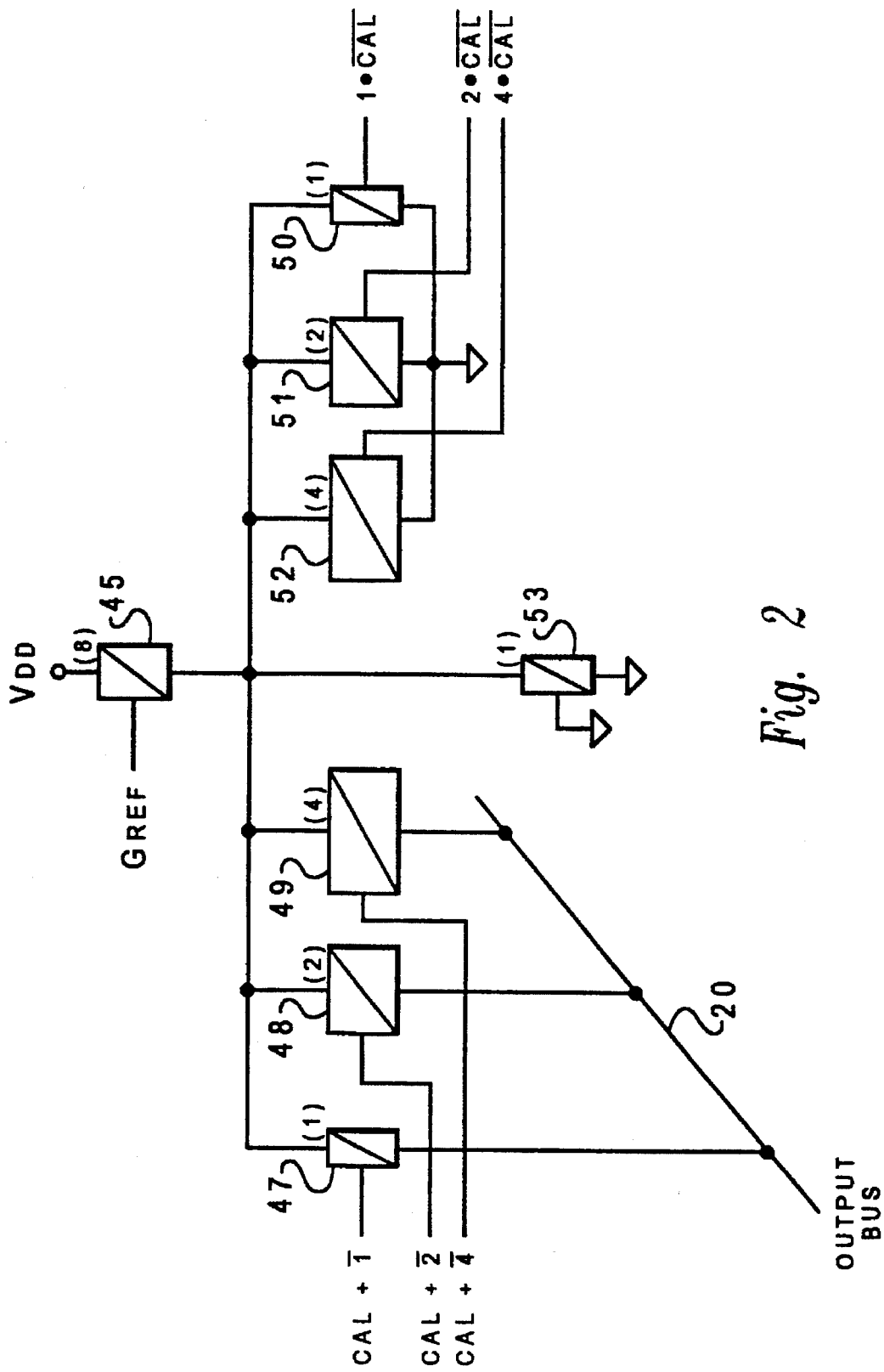
FIG. 2 depicts an LSB circuit of the Current Sources And Switches according to a preferred embodiment of the present invention.

The LSB circuit of CSS 10 is shown schematically in FIG. 2. The three LSB input bits are referenced by their binary weighted current of 1, 2 and 4. This circuit provides low order output currents that are scaled in a binary fashion in proportion to the weight (i.e. numerical significance) of the input bits. There is a single current source 45 sourcing current at a level of 8 Units.

Current source 45 is implemented in the preferred embodiment using PFET transistor technology. As shown in FIG. 2, the symbol for a PFET transistor, as will be used in all figures to show a PFET, is a rectangular box with a diagonal line running across the middle. The top and bottom connections to the symbol are the source and drain, respectively. The side connection to the PFET symbol is the input to the gate. The number in parenthesis just above the PFET indicates the magnitude of the current source in Units. This notation will be used in all schematics to indicate the value of a current source's output for all current sources. The varying magnitudes of the transistor currents can be accomplished by providing different sized transistors, as will be appreciated by those skilled in the art. As will also be appreciated by those skilled in the art, different sized transistors can be made by varying the W/L ratio. The relative size of a transistor is graphically shown in the figures by the length the box symbol. The signal GREF at the gate of the PMOS transistor forming current source 45 is a reference voltage common to all current sources in CSS 10, and is usually developed in a feedback circuit to set the current source's output current to some precise value that does not depend on "on chip" components.

Each of the transistors 47–52 are binary weighted to allow currents of 1, 2 or 4 Units to be switched to the output bus or ground. Each of the transistors 47–52 act as switches to decode the first three LSBs into 0–7 Units of current. Therefore, each of the transistors 47–49 will be switched to provide 0–7 Units of current on the output bus 20, depending on the binary digital input. Because the current source 45 must be equivalent to an 8-Unit segment, the additional transistor 53 switches the remaining 1 Unit of current to ground at all times. Of the pairs 47 and 50, 48 and 51, 49 and 52, one transistor will always be turned on, and one transistor will always be turned off. In this way, the total 8 Units produced by current source 45 will be drained to the output bus or ground as a function of the 3 LSB digital input and the calibration signal.

The complementary signals of the first, second, and third bits ($\overline{1}, \overline{2}, \overline{4}$ respectively) are input into PFET transistors 47, 48, and 49, respectively, each being logically ORed with CAL. The first three bits (1,2,4) are logically ANDed with the complement of CAL and input to PMOS transistors 50, 51, and 52, respectively. When operating in a normal operating mode, the signal $\overline{CAL}$ will be asserted and the calibration signal, CAL, will be negated. This allows the binary inputs to directly control the transistor pairs 47 and 50, 48 and 51, 49 and 52, such that one transistor will always be turned on, and one transistor will always be turned off, thereby providing a binary weighted conversion of the first three LSBs of the 10-bit DAC on the output bus 20.

Figure 3:
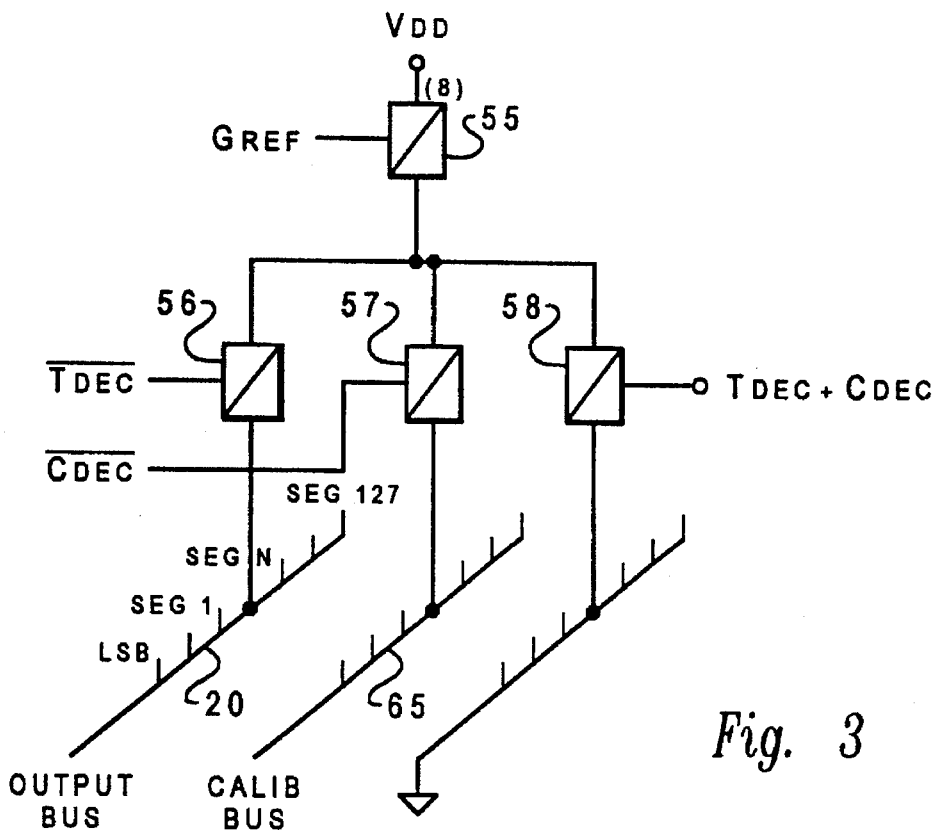
FIG. 3 depicts a schematic diagram of a single segment in the Current Sources And Switches according to a preferred embodiment of the present invention.

Referring now to FIG. 3, there is shown a schematic diagram of a single segment in CSS 10, according to a preferred embodiment of the present invention. CSS 10 contains 127 segments that are equal valued current sources, all with weights of 8 Units. The higher order 7 bits input to the DAC are decoded by either thermometric decoder 16 or calibration decoder 18 to switch one or more of these 127 segments. The PFET 55 is turned on by GREF to produce a current source of 8 Units of current. This 8 Units of current is connected to output bus 20, calibration bus 65, or ground through switches 56, 57, and 58, respectively. Each of the transistors 56, 57, 58, are PFETs and are switched by a control signal from thermometric decoder 16, a control signal from calibration decoder 18, and a logical ORing of the complements of these control signals, respectively.

If a given segment receives its control signal from thermometric decoder 16, the 8 Units of current from current source 55 will be switched by transistor 56 to output bus 20. When the DAC is in calibration mode, as indicated by the CAL signal output from CCTL 60, the CAL signal will enable calibration decoder 18 and disable thermometric decoder 16. This will negate the thermometric decoder control signal, turning transistor 56 off. Subsequently, if the segment receives a control signal from the calibration decoder 18, transistor 57 is turned on and the 8 Units of current from current source 55 is switched to calibration bus 65. When neither decoder is outputting a control signal to a given segment, transistors 56 and 57 turn off, and transistor 58 turns on, switching current source 55 to ground.

In summary, during normal operation, when the thermometric decoder 16 outputs a control signal to a particular segment, the segment is switched to the output bus. During calibration, an output control signal from the calibration decoder 18 will switch the segment current source to the calibration bus. When neither decoder is providing a control signal to a particular segment, the current source is switched to ground.

Figure 4:
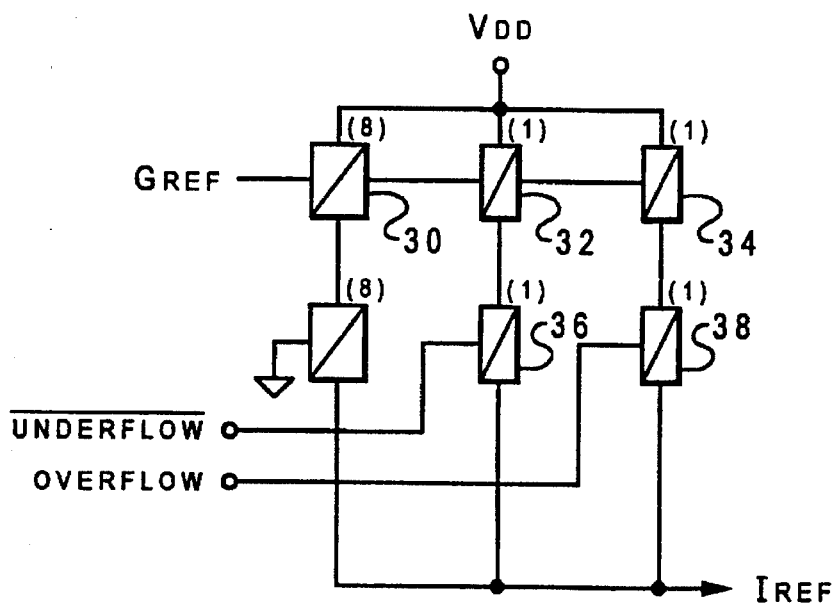
FIG. 4 shows a schematic diagram of a calibration reference according to a preferred embodiment of the present invention.

Referring now to FIG. 4, there is shown a schematic diagram of calibration reference 24. Three current sources are controlled by GREF. An 8 Unit current source 30 is switched to the output of calibration reference 24 at all times. A 1-Unit current source 32 is switched to the calibration reference output by the complement to the UNDERFLOW signal, and another 1-Unit current source 34 is switched to the calibration reference output by the OVERFLOW signal. Initially, both signals are negated, turning on transistor 38 and turning off transistor 36. If an OVERFLOW signal is received, the reference current is reduced by the cutoff of transistor 38. If the UNDERFLOW signal is received, the current from transistor 32 is added to the reference current by transistor 36 turning on. Although the preferred embodiment only describes a single level of adjustment for the calibration reference (i.e., either one increment up or down), the significant non-uniformities of segments in CSS 10 may require that multiple levels of adjustment to the calibration reference be provided in calibration reference 24.

Referring again to FIG. 1, when in the calibration mode, as indicated by the CAL signal from CCTL 60, a digital code is sent from counter 62 in CCTL 60 to calibration decoder 18 to select one of the 127 segments. Calibration decoder 18 operates as a standard decoder and decodes a digital code to output a control signal on one of 127 output lines. As explained with FIG. 3, this will select a segment in CSS 10 for output on calibration bus 65. This output signal will be compared at comparator 26 with the calibration reference signal generated by calibration reference 24. The comparison signal produced by comparator 26 is returned as an input to CCTL 60.

Trim DAC 14 is a binary scaled DAC having binary weighted output currents that are used to trim the DAC output to bring it into calibration. The output levels of trim DAC 14 are routed to the output bus during normal operation and to the calibration bus while in the calibration mode. Trim DAC 14 receives its input digital code of bits R1–R4 from the memory output register 22 of RAM 12. The trim DAC LSB size is chosen to be smaller than the LSB of the segmented DAC components, which are comprised of thermometric decoder 16 and CSS 10, to provide sufficient resolution to meet specified linearity requirements. Thus, the number of bits required in the trim DAC depends on the largest error inherent in the processing that needs to be corrected, and the required integral linearity. In the preferred embodiment, 0.5 LSB integral linearity is needed and the process yields a maximum error of +/–3 LSBs. Thus, each step of the trim DAC will need to change the DAC output by 0.5 LSBs. In order to compensate for the maximum error, at least 12 steps are needed. Therefore, trim DAC 14 has been chosen to convert 4 binary bits into 16 different output levels.

Figure 5:
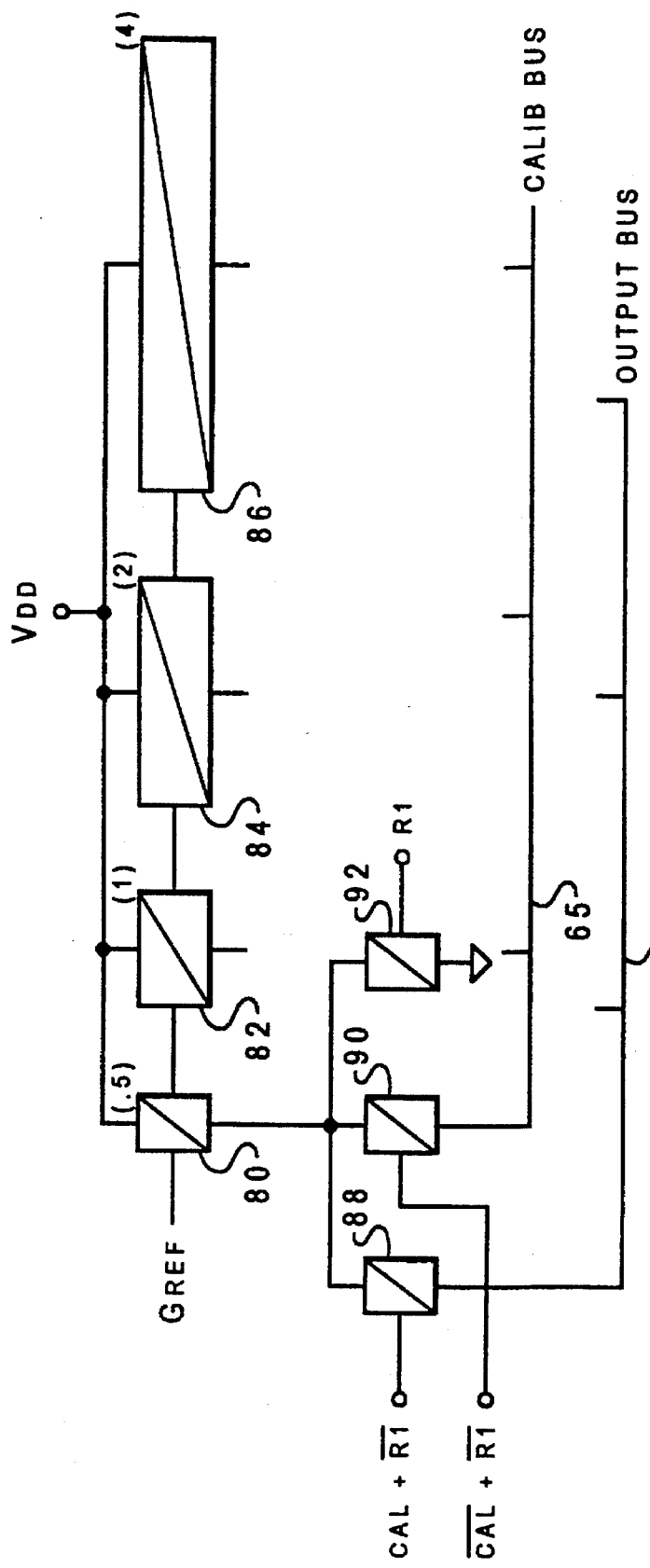
FIG. 5 shows a schematic diagram of a trim DAC according to a preferred embodiment of the present invention.

Referring now to FIG. 5, there is shown a schematic diagram of the trim DAC 14 of the preferred embodiment of the present invention. Each of the current sources 80–86 are PFETs controlled by GREF. They are sized 0.5, 1, 2, 4 Units, respectively, to produce 0.5, 1, 2, 4 times the current relative to each other. Each current source is switched to the output bus 20, the calibration bus 65, and ground by switches 88, 90, 92, respectively. Each of the digital bits R1, R2, R3, R4 received from register 22 switch the current path for one of the current sources 80–86. The LSB (R1) switches the current path for current source 80, with the remaining bits (R2–R4) controlling the current path for the current sources 82, 84, 86, respectively. The switches 88–92 are logically controlled by a digital bit R1 (with identical switches not shown being controlled by R2, R3, or R4) and by the calibration indication signal (CAL) such that an asserted digital bit will switch its output current source to the output bus 20 during normal operation, and to the calibration bus during the calibration mode. If an associated bit is not asserted, the current source is switched to ground by switch 92.

Figure 6:
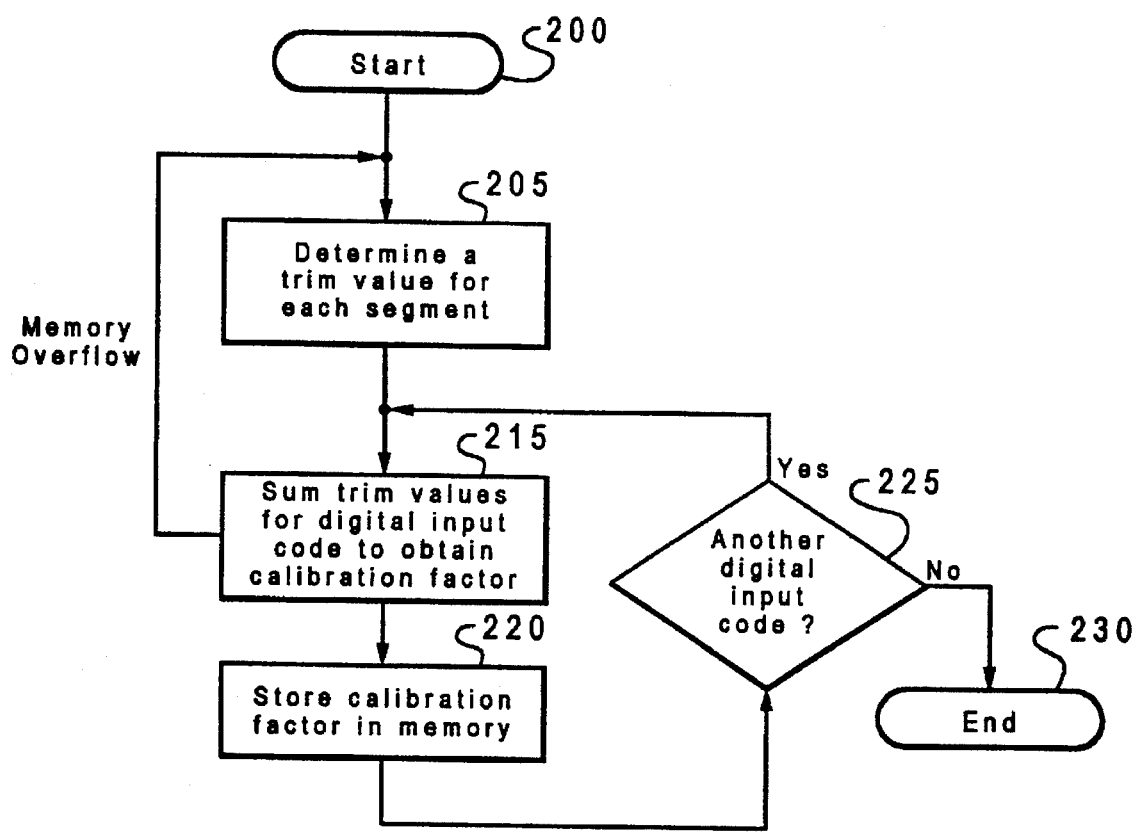
FIGS. 6–7 depict a flow diagram of a calibration procedure according to a preferred embodiment of the present invention.

Referring now to FIG. 6, there is depicted a flow diagram of the calibration procedure of the present invention. This process can be considered a two-stage process. For the first stage, the trim values for the individual segments are determined (Step 205) and are stored in numerically increasing memory addresses corresponding to each segment. Since any analog output step of the DAC in normal operation is the sum of a segment corresponding to the digital input code and all lower segments, the trim value needed for normal operation is similarly the sum of the trim values of the corresponding segment and those of all lower segments. Accordingly, a second stage is required to convert the individual trim values to sums associated with each output step. This is accomplished by starting at the highest address in RAM memory that corresponds to the highest digital input code, and adding the trim value at that address with the trim values contained in all lower addresses (Step 215), and storing the resulting sum at that address (Step 220). This procedure is repeated at the next lower address (Step 225), and so on until the lowest address is reached (Step 230). The lowest address always contains zero, unless it is desired to trim the base output step to some non-zero value.

Referring again to FIG. 1, in conjunction with FIG. 6, calibration of the DAC is performed under the control of the CCTL 60. The process begins at step 200 when CCTL 60 receives a start command. There, both of the signals CAL and BUSY are set. An asserted CAL signal disables thermometric decoder 16 and enables calibration decoder 18. The output from the counter 62 is sent to both calibration decoder 18, and multiplexor 96. The asserted CAL signal switches multiplexor 96 to input the counter 62 output into RAM 12 at its address port ADR.

Figure 7:
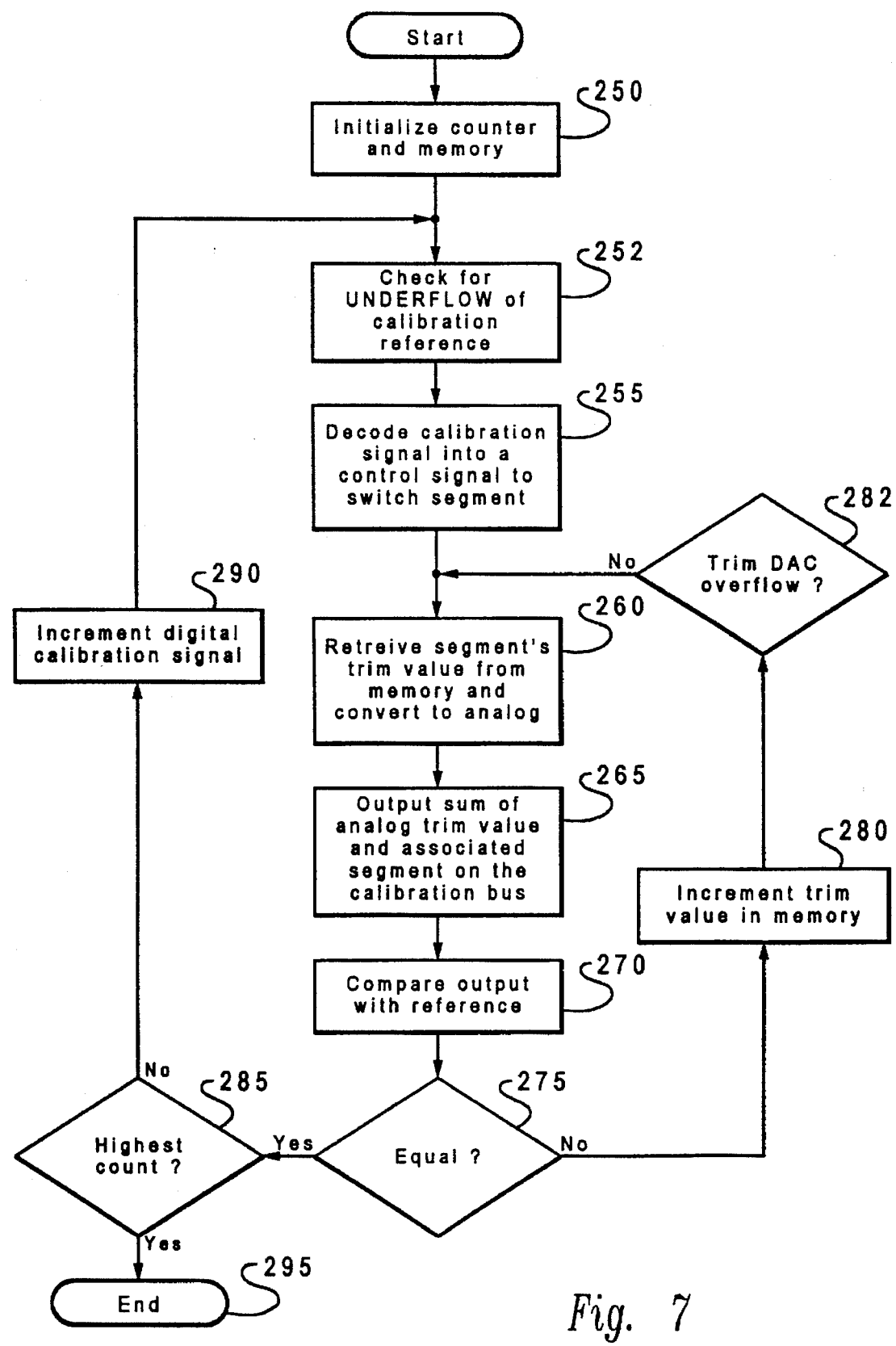

The process proceeds to step 205 where a trim value is determined for each segment. Referring to FIG. 7, there is depicted a flow diagram for the step 205. The process starts and proceeds to step 250, at which point the counter 62 is at 1, and all values in RAM 12 are set to zero. At step 252, the output of comparator 26 indicates that the segment's output current is higher than the calibration reference 24 current, the calibration reference must be adjusted, since the trim value cannot be lowered from the initial 0 starting value. Since the initial comparison of this given segment shows that its current source is larger than the calibration reference, a larger calibration reference current must be used to calibrate this particular segment. In that case, the UNDERFLOW line is set in calibration reference 24. As explained previously with FIG. 4, this will increase the calibration reference current by a predetermined amount. In such an event, any calibration which had been performed at a previous count of the counter, would have been made with reference to the original calibration reference current. In order to uniformly calibrate all segments to a common reference, all segments must be recalibrated to this new calibration reference. Therefore, register 22, register 94, and the counter 62 are reset, and the entire calibration procedure is repeated from step 250 with the UNDERFLOW line asserted. At step 255, the calibration input signal to calibration decoder 18 asserts the control signal on control signal output pin 1, thereby switching an associated segment 1 in CSS 10 to calibration bus 65.

At step 260 the counter 62 addresses the memory location in RAM 12 corresponding to this associated segment 1. The memory contains a trim value for the associated segment (0 initially) which is converted to an analog trim value by trim DAC 14 and outputted on the calibration bus 65. If the comparison at step 270 of a given segment's current shows the calibration reference current from calibration reference 24 is greater than the segment's current, they are not equal to within a preselected tolerance (a tolerance of 0.5 LSB in the preferred embodiment).

The process proceeds to step 280, where the trim value corresponding to the given segment is incremented in memory. The TRIM/SUM signal is asserted on multiplexor 98. This switches a high signal, or logical 1, into adder 100. Adder 100 sums the input from multiplexor 98 with the output of register 22 and stores the sum in register 94. Also, the WRITE line is asserted on RAM 12. If the trim value has not been incremented yet, the output of register 22 is still 0, so a logical 1 is stored in register 94. This is accomplished by asserting the write signal on RAM 12 and writing the contents of register 94 into the selected segment's memory address (as indicated by the counter's digital input signal). The value in register 94 would be the sum (from Adder 100) of previous trim value output from register 22 and 1 (output from multiplexor 98).

The process then returns to step 260, where the value stored in register 94 is written to RAM 12, which in turn is output as an analog output on calibration bus 65 by trim DAC 14—for example, 0.5 LSB if the trim value is 1. The output of calibration bus 65 is allowed to settle (Step 265), and then a comparison is again made by comparator 26 (Step 270). If the trim value is 1, this comparison would compare the output current of calibration reference 24 with the given segment current from CSS 10 and 0.5 LSB of current from trim DAC 14. If the comparison again shows that the calibration bus current is still below the reference current (Step 275), the trim value from trim DAC 14 is again incremented (Step 280). This process of incrementing the trim DAC and comparison would continue until, at step 275, the comparison indicated that the selected segment's current, plus the trim DAC output current had exceeded the reference value.

At that point, the sum of the segment's current and the trim value is within one trim DAC LSB of the calibration reference. As explained previously, one trim DAC LSB is less than or equal to the integral linearity required for the DAC. This trim value is left at the corresponding address in RAM 12. Then, the process proceeds to step 285 where, if the highest count of the counter has not been reached, the calibration procedure is repeated for the next selected segment by proceeding to step 290, wherein the counter is incremented and registers 22, 94 are reset. This process is repeated by incrementing the counter 127 times, wherein at each increment a different calibration digital input switches an associated segment to the calibration bus until the highest count is attained at step 285.

It is possible that during step 280 of the calibration procedure, a selected segment may have a sufficiently low current that the trim DAC 14 analog output will have been incremented to its maximum value without the calibration bus current exceeding the reference current. In such an event, as seen at step 282, the OVERFLOW line in calibration reference 24 is asserted by adder 100, and the entire calibration procedure for all segments must be repeated from step 250 using the new calibration reference current. There may be situations where the calibration procedure will not complete—for example, if one segment is too low and another is too high, forcing the UNDERFLOW and OVERFLOW to be continually set. To detect this, a time limit could be set on the calibration after which an error signal is set.

Referring back to FIG. 6, the process proceeds to step 215 from step 205 after segment counter 62 reaches its highest value of 127 at step 295 in FIG. 7. At this point, all segments have been trimmed, and a trim value for each segment is stored in RAM 12. The process continues with switching multiplexor 98 by deasserting TRIM/SUM to connect the output of register 94 to the input of adder 100.

Segment counter 62 is then decremented down to 0. At each decrement of the counter, the next lower address in RAM 12 is addressed, and the trim value stored there is output by register 22. Each addressed trim value is added with the previous sum of adder 100, which is held in register 94 and input into adder 100 by multiplexor 98. This process continues until the trim value stored in all lower addresses are added to the value held in the RAM 12 at the current (i.e., 127) address. This sum is stored at that current address at step 220.

The process continues to pass through step 225, where the calibration procedure is repeated for all possible digital input values, so that a digital calibration factor is produced for each digital input code and it is stored in memory at an address corresponding to the associated segment, wherein the digital calibration factor is the sum of the associated segment's trim value and all lower trim values stored in RAM 12.

If at any time during the sum step 215 of the calibration procedure an overflow error occurs in a storage location of RAM 12 (i.e., the number becomes too large to store), the UNDERFLOW line in the calibration reference 24 would be set, and the entire calibration procedure would have to be repeated with respect to this new calibration reference current, as indicated by the "Memory Overflow" returning the process to step 205.

When the summation step of the calibration procedure has completed for every segment, the calibration procedure ends at step 230, as indicated by a negative decision at step 225. At step 230, the signals CAL and BUSY are deasserted, indicating the DAC is now operating in normal operational mode.

During normal operational mode, a digital input signal is decoded by thermometric decoder 16, setting a plurality of control signals, wherein the number of control signals set is proportional to the digital input signal. These control signals switch their associated current sources in CSS 10 to produce an analog output step equivalent to the digital input code. According to a preferred embodiment, a segment corresponding to the digital input, and all segments corresponding to lower digital input values are activated. At the same time, the digital input signal is input at the address pin of RAM 12 by multiplexor 96. This accesses the digital calibration factor for the associated analog output step, which is stored at the memory location addressed by the digital input code. The digital calibration factor is added to the output current from CSS 10 on output bus 20.

In summary, the present invention provides a self-calibrating segmented DAC, which self-calibrates with respect to a single calibration reference, thereby providing improved differential and integral linearity. The segmented DAC self-calibrates by determining a trim value for each segment. Then, for every digital input code, the trim values for all segments preselected to be switched on in response to that particular input code are summed to produce a digital calibration factor. Last, each digital calibration factor is stored at an address equal to its associated digital input signal. Because each segment was calibrated against a single calibration reference, the differential linearity of each digital input code is substantially improved over the prior art. Additionally, because an analog output level is produced by the sum of output currents of a plurality of segments, each trimmed with reference to the same calibration reference, the integral linearity is substantially improved.

While the invention has been particularly shown and described with reference to a preferred embodiment, it will be understood by those skilled in the art that various changes in form and detail may be made therein without departing from the spirit and scope of the invention.

What is claimed is:

1. A self calibrating digital-to-analog conversion system for converting a digital input signal to an equivalent analog output signal, the system comprising:
   an output bus;
   a calibration bus;
   a calibration reference signal generator;
   a first digital-to-analog converter, including a plurality of segments, that receives a given digital input signal and a given calibration digital input signal, and that outputs on the output bus a particular analog output, created by a plurality of segments preselected to be enabled by the given digital input signal, the analog output being an analog equivalent of the digital input signal, and that outputs on the calibration bus a calibration analog output, created by a single segment preselected to be enabled by the calibration digital input signal;
   a memory containing a digital calibration factor associated with each possible digital input signal, each digital calibration factor being stored at an address equal to the digital input signal;
   calibration control and timing logic that indicates a calibration mode, outputs the calibration digital input signal, and multiplexes either the digital input signal or the calibration digital input signal to the memory as a function of the calibration mode, the multiplexed signal being received by the memory as an input address;
   a second digital-to-analog converter for converting an addressed digital calibration factor into an analog trim value, and outputting the analog trim value on either the output bus or the calibration bus as a function of the calibration mode indication;
   comparison circuitry receiving the analog trim value and the calibration analog output summed on the calibration bus, and receiving a calibration reference signal generated by the calibration reference signal generator, the comparison circuitry comparing the output of the calibration bus with the calibration reference signal to produce at least one comparison signal; and
   means for determining a trim value for each segment, wherein a trim value is equal to an analog trim value that produces a comparison signal within a preselected tolerance, for summing a plurality of trim values to produce a digital calibration factor associated with each digital input signal, wherein the plurality of trim values are the trim values for the plurality of segments preselected to be enabled by the given digital input signal, and for storing each digital calibration factor in memory at an address corresponding to its associated digital input signal.

2. A self calibrating digital-to-analog conversion system for converting a digital input signal to an equivalent analog output signal, according to claim 1, wherein the first digital-to-analog converter comprises:
   a first decoder for decoding the digital input signal into a plurality of output control signals;
   a second decoder for decoding the digital calibration input signal into a selected output control signal;
   a plurality of segments producing equally weighted segment signals;
   a first set of switches, wherein each switch connects a corresponding segment to the output bus when receiving a corresponding output control signal from the first decoder; and
   a second set of switches, wherein each switch connects a corresponding segment to the calibration bus when receiving a corresponding output control signal from the second decoder.

3. A self calibrating digital-to-analog conversion system for converting a digital input signal to an equivalent analog output signal, according to claim 1, wherein the segments are current sources.

4. A self calibrating digital-to-analog conversion system for converting a digital input signal to an equivalent analog output signal, according to claim 1, wherein the segments are voltage sources.

5. A method of self calibration for a segmented digital-to-analog converter, wherein the segmented digital-to-analog converter converts a digital input code to an analog output equal to the sum of an analog output and an analog calibration factor, further wherein the digital input code has an associated segment and wherein a particular digital input code received by the segmented digital to analog converter produces an equivalent analog output the method comprising the steps of:

determining a trim value for each segment of a segmented digital to analog converter;

storing the trim values in memory;

summing a plurality of trim values to produce a digital calibration factor associated with each given digital input signal, wherein the plurality of trim values are the trim values for a plurality of segments preselected to be enabled by the given digital input signal; and storing each digital calibration factor in memory at an address corresponding to the digital input signal;

wherein the step of determining a trim value for each segment comprises the steps of:

(a) decoding a calibration digital input signal into a corresponding control signal that switches an associated segment to a calibration bus;

(b) addressing a memory location at an address corresponding to the calibration digital input signal to obtain a trim value stored at the memory location;

(c) converting the trim value to an analog trim value, and outputting the analog trim value, in sum with the associated segment, on the calibration bus;

(d) comparing the signal on the calibration bus with a calibration reference signal; and (e) if the compared signals are not equal to within a preselected tolerance, adjusting the trim value in the memory location, and repeating steps (b)–(e).

6. A method according to claim 5, further comprising the step of, if the comparison shows the calibration bus signal to be higher, beyond the preselected tolerance, than the calibration reference, incrementing the calibration reference and repeating all steps.

7. A method according to claim 5, wherein the step of adjusting the trim value in memory comprises the steps of, if the comparison shows the calibration bus signal to be lower, beyond a preselected tolerance, than the calibration reference:

(f) incrementing the trim value in memory;

(g) converting the trim value to an analog trim value, and outputting the analog trim value, in sum with the associated segment, on the calibration bus;

(h) comparing the signal on the calibration bus with the calibration reference;

(i) if the comparison shows the signal to be lower than the calibration reference, repeat steps (f)–(i).

8. A method according to claim 5, further comprising the step of, if a memory location has an overflow, decrementing the calibration reference and repeating all steps.

* * * * *